United States Patent [19]
Saruwatari

[11] Patent Number: 5,949,699
[45] Date of Patent: Sep. 7, 1999

[54] SEMICONDUCTOR INTEGRATED CIRCUIT DEVICE

[75] Inventor: Yasuhiro Saruwatari, Tokyo, Japan

[73] Assignee: NEC Corporation, Tokyo, Japan

[21] Appl. No.: 09/104,041

[22] Filed: Jun. 25, 1998

[30] Foreign Application Priority Data

Jun. 25, 1997 [JP] Japan ................................. 9-169234

[51] Int. Cl.⁶ ................................................. G11C 7/00
[52] U.S. Cl. ................................................ 365/51; 365/63
[58] Field of Search .......................... 365/51, 63, 230.03

[56] References Cited

U.S. PATENT DOCUMENTS 5,422,839  6/1995  Ishibashi et al. ........................ 365/63
5,708,612  1/1998  Tanoi ....................................... 365/51

*Primary Examiner*—Vu A. Le
*Attorney, Agent, or Firm*—Foley & Lardner

[57] ABSTRACT

In a semiconductor integrated circuit device in which metal assist wires (2) such as aluminum assist wires for operating word lines (1) at high speed are disposed in parallel to the word lines, the metal assist wires (2) are disposed so as to extend to and terminate on halfway positions toward both ends of the word lines (1), and signal/power source lines (10, 11) are formed of the same metal wiring layer as that of the metal assist wires in parallel to digit lines (4) in an area locating from the end portions of the metal assist wires to the end portions of the word lines.

6 Claims, 4 Drawing Sheets ns5,949,699

SEMICONDUCTOR INTEGRATED CIRCUIT DEVICE

BACKGROUND OF THE INVENTION

1. Field of the Invention

The present invention relates to a semiconductor integrated circuit device, and more particularly to such a semiconductor integrated circuit device as a semiconductor memory device in which metal wires are arranged as assist wires in parallel to word lines in order to operate the word lines at a high speed.

2. Description of the Related Art

A method in which word lines and metal wires (the description is made on the assumption that the metal wires are formed of aluminum) are arranged in parallel to each other and connected at certain intervals (hereinafter referred to as "an aluminum assist method for word lines") has been known as a technique for operating word lines of a static random access memory (hereinafter referred to as "SRAM").

The construction of SRAM using the conventional aluminum assist method for word lines will be described with reference to FIG. 1. FIG. 1 is a diagram showing the construction of SRAM using the conventional aluminum assist method for word lines.

In FIG. 1, reference numeral 1 represents word lines formed of polysilicon, reference numeral 2 represents assist wires disposed in parallel to the word lines so as to form the second aluminum wiring layer, and reference numeral 3 represents contacts for connecting the word lines and the aluminum assist wires. In FIG. 1, the word lines 1, the contacts 3 and the assist wires 2 are illustrated as being arranged on the same plane, however, they are actually arranged longitudinally as shown in FIG. 2 which is a vertical cross-sectional view of the end portion of the word lines. Reference numeral 4 represents digit lines which is disposed so as to form the first aluminum wiring layer, and reference numeral 5 represents an X decoder for selecting a word line.

Reference numeral 6 represents a peripheral circuit A formed at one end portion of the digit line 4, and reference numeral 7 represents a peripheral circuit B formed at the other end portion of the digit line 4. The peripheral circuit A includes a system extending from an address buffer circuit to a decoder circuit for selecting a word line, a system extending from an address buffer circuit to a decoder circuit for selecting a division number (hereinafter referred to as "section") of the word lines, a clock system circuit for controlling the inside on the basis of a clock which is generated due to switching of addresses, a control system circuit of CE2, a control system circuit of WE, and pads for each address, control system, GND, etc. Further, the peripheral circuit B includes a system extending from an address buffer to a decoder circuit for selecting a digit line, a clock system circuit for controlling the inside on the basis of a clock generated due to the switching of the addresses, a control system circuit for CE1 and OE, a sense amplifier circuit, an input/output transistor, and pads for each address, CE1, input/output, VCC, etc.

Reference numerals 8 and 9 represent array portions which are designed in a cell-pitch structure and disposed around the digit lines. Reference numerals 10 and 11 represent signal/power source lines through which signals are transmitted between the peripheral circuits A and B. The signal lines include a signal line for a control system of CE1, CE2 system for controlling the switching between a standby state and an active state, a signal line for a control system of WE for controlling the switching between WRITE and READ, a signal line for the clock system, a signal line for selecting a section, etc.

In FIG. 1, reference numeral 14 represents a semiconductor chip on which the integrated circuit is formed. Memory cells which are not shown in FIG. 1 are arrayed in an area where the word lines and the digit lines are extended. Each memory cell is connected to both a word line and a digit line. In FIG. 2, reference numeral 13 represents a memory cell array area, and reference numeral 15 represents an insulation layer within which the word lines 1, the assist wires 2, the contacts 3, the digit lines 4 and the signal/power source lines 10, 11 are formed.

The above is a general layout construction of SRAM.

Next, the high-speed operation of the word lines by the aluminum assist method for the word lines will be described with reference to FIGS. 3 and 4.

FIG. 3 is a partial construction diagram showing the connection relationship between the X decoder 5, the word lines 1 and the assist wires 2 of SRAM using the aluminum assist method of the word lines, and FIG. 4 is a partial construction diagram showing the connection relationship between the X decoder 5 and the word lines 1 of SRAM using no aluminum assist method for word lines. In FIG. 1, the contacts are formed at fixed intervals between the word lines and the aluminum assist wires. However, in FIG. 3, contacts 3 are formed at two positions of a near end portion and a far end portion relative to the X decoder 5.

In FIG. 3, reference numeral 1 represents a word line formed of polysilicon, reference numeral 2 represent an aluminum assist wire which is arranged in parallel to the word line, reference numeral 3 represents contacts for connecting the word line and the assist wire, and reference numeral 5 represents an X decoder for selecting a word line. In FIG. 4, reference numeral 1 represents a word line formed of polysilicon, and reference numeral 5 represents an X decoder for selecting a word line. The symbol L in FIGS. 3 and 4 represents the wire length of the word line.

In the SRAM using no aluminum assist method for word lines shown in FIG. 4, the time T which is required for the operation of selection or non-selection of word lines is expressed by the following equation for simplicity's sake:

$$T = crL^2 \qquad (1)$$

Here, c represents capacitance of the word line per unit length, and r represents resistance of the word line per unit length. The portion of the word line which requires the longest operation time is located at the far end portion which is farthest from the X decoder 5.

In the SRAM using the aluminum assist method for word lines shown in FIG. 3, with respect to the time T required for the operation of selection or non-selection of word lines, the resistance of the aluminum assist wire is negligibly small as compared with that of the word line made of polysilicon, and thus the operation time of selection or non-selection of the aluminum assist wire can be neglected. Therefore, the longest time is required for the center position between the contacts. Further, the overall resistance is equal to ¼ of that of the case of FIG. 4 and the capacitance which is driven by the X decoder is not varied. Therefore, the time T is expressed as follows:

$$T = (¼)crL^2 \qquad (2)$$

It is therefore apparent that the operation time is reduced to ¼ as compared with the equation (1).

As is apparent from the foregoing description, the operation time for selection or non-selection of word lines can be reduced by applying the aluminum assist method for word lines to SRAM.

However, in the SRAM using the aluminum assist method for word lines, the assist wires are disposed in parallel to the word lines in the memory cell array area so as to form the second aluminum wiring layer, and thus it is impossible to arrange the signal lines and power source lines in parallel to the digit lines perpendicular to the word lines so as to form the second aluminum wiring layer in the memory cell array area. Further, the first aluminum wiring layer is used only for the digit lines, because the chip size is reduced and thus the digit line width and the digit line interval are normally set to design standard values of a diffusion process or near values and therefore, it is also impossible to arrange signal line or power source line other than the digit lines in the first aluminum wiring layer so as to be parallel to the digit lines. Therefore, as shown in FIGS. 1 and 2, the signal/power source lines 10, 11 must be disposed so as to separate from the memory cell array area. In FIG. 2 which is a cross-sectional view showing the word line end portion of the SRAM using the conventional aluminum assist method for word lines, it is shown that the signal/power source lines 10 are arranged outside of the memory cell array area 13 where the word lines 1, the assist wires 2, the contacts 3 and the digit lines 4 are disposed.

The signal lines are directed from the peripheral circuit A to the peripheral circuit B or from the peripheral circuit B to the peripheral circuit A, and have a length which is equal to or longer than the digit line length. Therefore, from the viewpoint of the operation timing of SRAM, the signal lines must be formed in the wiring layer having low resistance, so that the second aluminum or first aluminum wiring layer is required to be used. Further, it is necessary to design the signal lines so that the wire width thereof is set to not small value and the wire interval is as large as possible in order to reduce the signal delay from the peripheral circuit A to the peripheral circuit B or from the peripheral circuit B to the peripheral circuit A. With respect to the power source lines, power source lines having a large wire width are used in order to reduce the wire resistance as greatly as possible.

Since the wiring areas as described above are kept for the signal lines and the power source lines, the increase of the length of the semiconductor chip in the word line direction cannot be neglected. Although the values are varied in accordance with a specification of an article, for 1M SRAM having a design standard of about 0.4 $\mu$m, the width of the power source lines is set to about 20 $\mu$m, and the signal line area is set to 15 $\mu$m because the number of the signal lines is equal to 5 to 10 (in this case, the width and interval are considered on the assumption that the number of signal lines is equal to 7.5). Therefore, assuming that totally four power source lines of VCC, GND are provided at both the sides, the increase of the length in the word line direction becomes about 100 $\mu$m.

For an article of 0.4 $\mu$m standard, the chip size is set so that the short side thereof is equal to about 3.5 mm and the long side thereof is equal to about 6.5 mm, and thus the area of the chip is set to about 22.75 mm$^2$. Therefore, the chip size is made increased for the wiring area of the signal lines and the power source lines of FIG. 1 by at least 100 $\mu$m×long side, that is, by about 3%. This induces a critical problem from the viewpoint of the recent trend of further increasing the integration degree of the semiconductor integrated circuits.

SUMMARY OF THE INVENTION

The present invention has been implemented in view of the foregoing situation, and has an object to provide a semiconductor integrated circuit device which can reduce the chip size while using an aluminum assist method of operating word lines at high speed.

According to the present invention, in order to attain the above object, there is provided a semiconductor integrated circuit device in which metal assist wires for increasing an operating speed of word lines extending from a decoder are disposed in parallel to the word lines, characterized in that each of the metal assist wires extends from a first position near the decoder to a second position between the first position and an end portion of a word line, and signal/power source lines are formed in parallel to digit lines in an area locating between end portions of the metal assist wires corresponding to the second position and the end portions of the word lines.

The metal assist wires may be connected to the word lines at least at the first and second positions. The signal/power source lines and the metal assist wires may be arranged to form the same metal wiring layer. The word lines may extend from the decoder at both sides thereof.

Further, according to the present invention, there is provided a semiconductor integrated circuit device in which metal assist wires for increasing an operating speed of word lines extending from a decoder are disposed in parallel to the word lines, characterized in that:

signal/power source lines are arranged to form the same metal wiring layer as that of the metal assist wires in parallel to digit lines at a center of overall memory cell array areas;

two decoders for selecting word lines are provided to divide the overall memory cell array areas into three parts of a center area portion and both end area portions;

metal assist wires are provided in parallel to the word lines at the center area portion so as to extend from the vicinity of the decoders to the vicinity of the signal/power source lines disposed at the center of the overall memory cell array areas;

metal assist wires are provided in parallel to the word lines at both the end area portions so as to extend from the vicinity of the decoders to halfway positions toward end portions of the word lines at both the end area portions; and signal/power source lines are arranged to form the same metal wiring layer as that of the metal assist wires in parallel to the digit lines at both end portions of the overall memory cell array areas corresponding to an area from the halfway positions to the end portions of the word lines.

The metal assist wires may be connected to the word lines at least both ends of the metal assist wires.

According to the semiconductor integrated circuit device according to the present invention, the operation time of each word line which is the same level as when each metal assist wire is disposed so as to extend fully from the one end portion of the word line to the other end portion thereof in parallel to the word line can be achieved although each metal assist wire is disposed so as to extend halfway between both the end portions of the word line.

Further, the signal lines and the power source lines can be constructed in parallel to the digit lines by the same metal wiring layer as that of the metal assist wires in the area extending from the end portions of the metal assist wires to the end portions of the word lines, and thus the chip size can be reduced.

Still further, an empty area for the metal wires for the word line assist can be formed not only at both the end portions of the overall memory cell array areas, but also at the center portion thereof. Therefore, it is unnecessary to extend the signal lines to the end portions of the overall memory cell array areas when the signal lines reach to the center of the peripheral circuit at the outside of the memory cell array areas, so that the delay time can be reduced. In addition, the power source lines also can be disposed at the center portion and both the end portions of the overall memory cell array areas, and thus the power source line can be magnified.

DETAILED DESCRIPTION OF THE PREFERRED EMBODIMENTS

Preferred embodiments according to the present invention will be described hereunder with reference to the accompanying drawings.
<First Embodiment>

Figure 5:
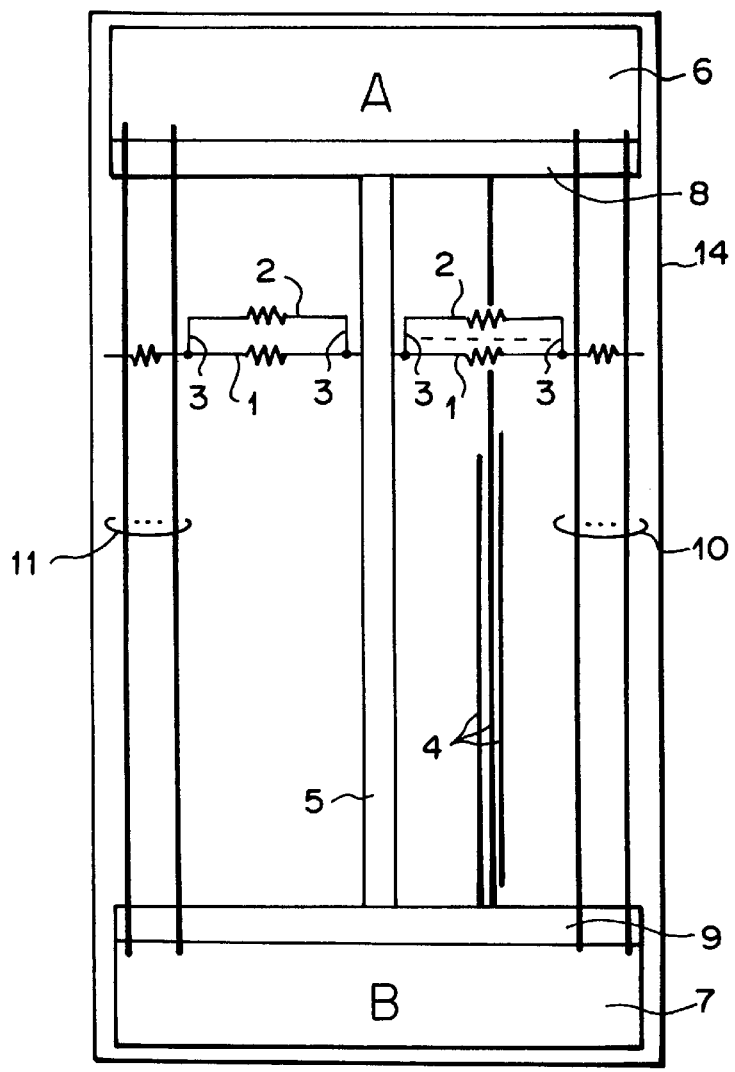
FIG. 5 is a diagram showing the overall construction of a first embodiment of semiconductor integrated circuit device according to the present invention.

FIG. 5 is a diagram showing the overall construction of a first embodiment of the semiconductor integrated circuit device of the present invention.

In FIG. 5, reference numeral 1 represents word lines formed of polysilicon, reference numeral 2 represents assist wires arranged in parallel to the word lines 1 so as to form the second aluminum wiring layer, reference numeral 3 represents contacts for connecting the word lines 1 and the aluminum assist wires 2, reference numeral 4 represents digit lines arranged so as to form the first aluminum wiring layer, reference numeral 5 represents an X decoder for selecting a word line, reference numeral 6 represents a peripheral circuit A provided at one end portion of the digit lines 4, and reference numeral 7 represents a peripheral circuit B provided at the other end portion of the digit lines 4.

In this embodiment, the peripheral circuit A contains a system extending from an address buffer circuit to a decoder circuit for selecting a word line, a system extending from an address buffer circuit to a decoder circuit for selecting a section, a clock system circuit for controlling the inside on the basis of a clock generated due to switching of addresses, a CE2 control system circuit, a WE control system circuit, and pads for each address, control system, GND, etc. The peripheral circuit B contains a system extending from an address buffer to a decoder circuit for selecting a digit line, a clock system circuit for controlling the inside on the basis of a clock generated due to switching of addresses, a control system circuit for CE1 and OE, a sense amplifier circuit, an input/output transistor, and pads for each address, CE1, input/output, VCC, etc.

Reference numerals 8, 9 represent array portions around the digit lines, which portions are designed in a cell-pitch structure. Reference numerals 10, 11 represent signal/power source lines (signal lines and power source lines) through which signals are transmitted between the peripheral circuit A and the peripheral circuit B. The signal/power source lines contain a signal line for the control system for the CE1, CE2 which controls the switching between a stand-by state and an active state, a signal line for the control system for WE which controls the switching between WRITE and READ, a signal line for the clock system, a signal line for selecting a section, etc.

Figure 6:
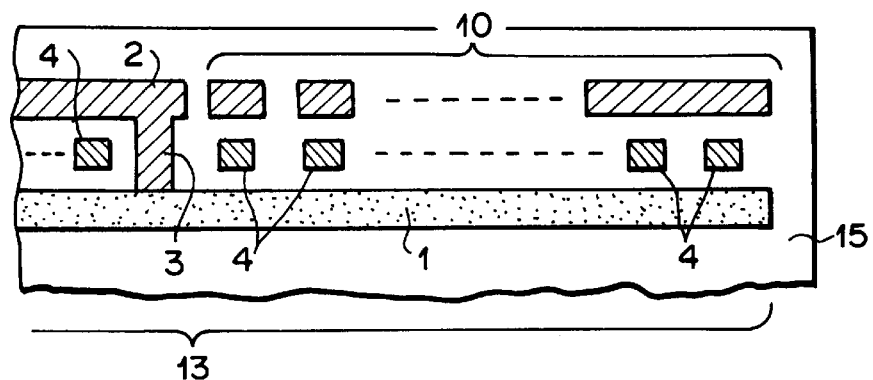
FIG. 6 is a cross-sectional view showing the end portions of the word lines the first embodiment.

In FIG. 5, reference numeral 14 represents a semiconductor chip on which the integrated circuit is formed. Memory cells which are not shown in FIG. 5 are arrayed in an area where the word lines and the digit lines are extended. Each memory cell is connected to both a word line and a digit line. In FIG. 6, reference numeral 13 represents a memory cell array area, and reference numeral 15 represents an insulation layer within which the word lines 1, the assist wires 2, the contacts 3, the digit lines 4 and the signal/power source lines 10, 11 are formed.

Figure 1:
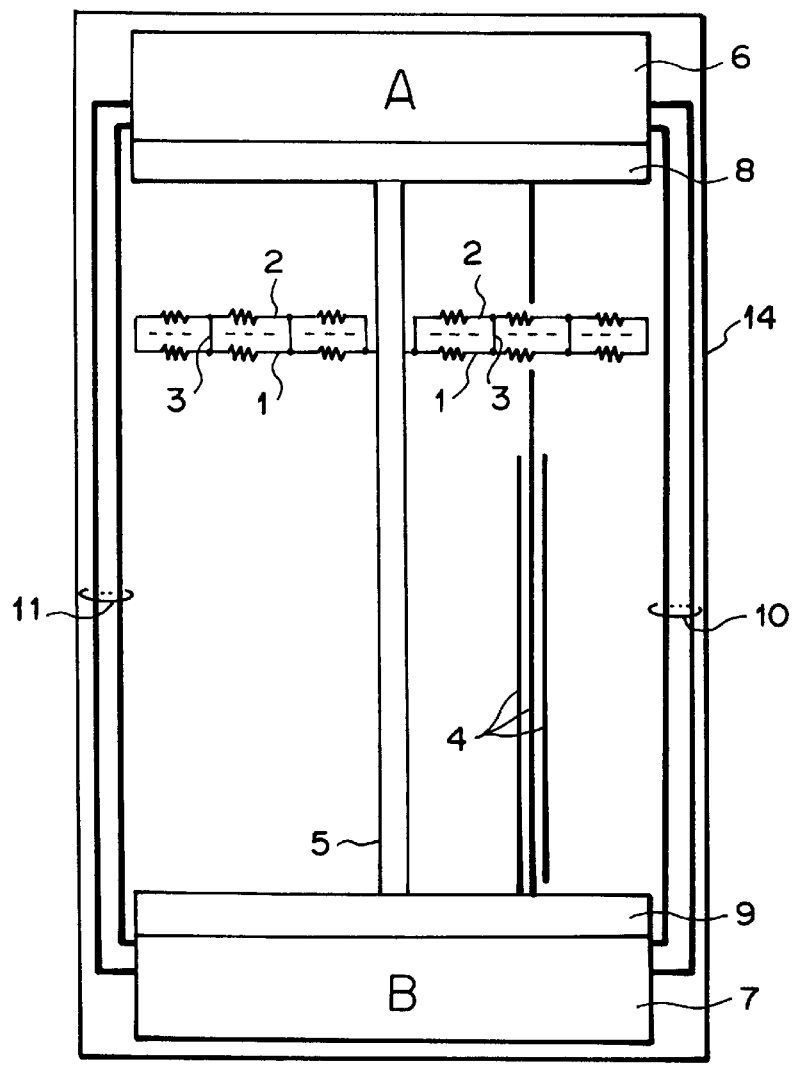
FIG. 1 is a diagram showing the construction of conventional SRAM using an aluminum assist method for word lines.

Next, the structurally different point of the semiconductor integrated circuit device of this embodiment from the conventional SRAM using the aluminum assist method shown in FIG. 1 will be described.

Figure 2:
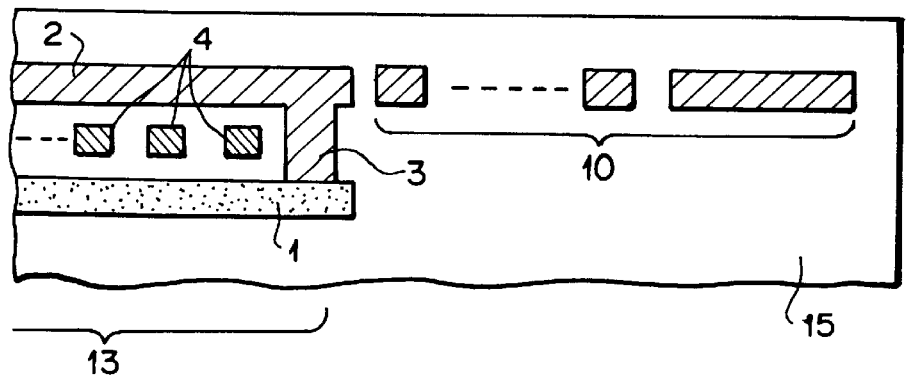
FIG. 2 is a cross-sectional view showing the end portion of the word lines in the conventional SRAM using the aluminum assist method or word lines.
Figure 3:
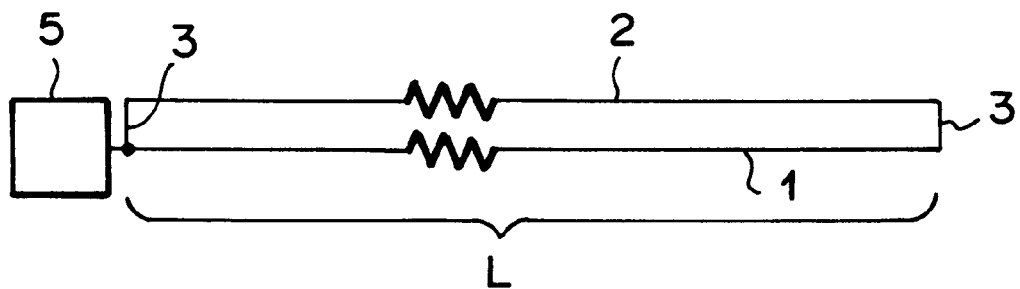
FIG. 3 is a partial construction diagram showing the connection relationship of an X decoder, the word lines and aluminum assist wires of the conventional SRAM using the aluminum assist method for word lines.
Figure 4:
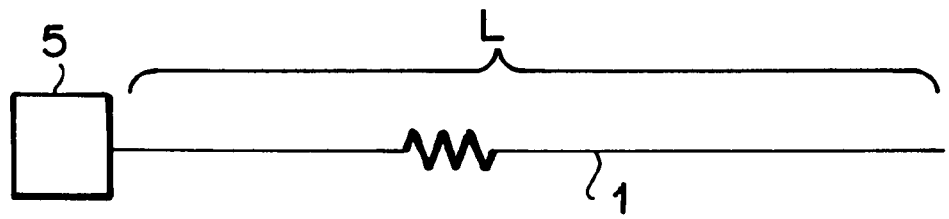
FIG. 4 is a partial construction diagram showing the connection relationship of the X decoder and the word lines in SRAM using no aluminum assist method for word lines.

The first difference resides in that the word line and the aluminum assist wire are contacted with each other at some midpoint between the center portion and the end portion instead of the end portion of the word line. The second difference resides in that the aluminum assist wires are disposed so as to extend to the above-mentioned outermost contact position (not to the end portion of the word line) in conformity with the outermost contact position. Further, the third difference resides in that the signal/power source lines 10, 11 are disposed in parallel to the digit lines between the end portions of the aluminum assist wires 2 and the end portions of the word lines 1. The comparison between FIGS. 2 and 6 makes it easy to understand the structural difference between the conventional SRAM and the SRAM of this embodiment. FIG. 6 is a cross-sectional view showing the end portions of the word lines of this embodiment, and shows such a state that the signal/power source lines 10 are arranged within the memory cell array area 13 where the word lines 1 and the digit lines 4 are existing. On the other hand, FIG. 2 shows such a state that the signal/power source lines 10 are arranged out of the memory cell array area 13.

Figure 7:
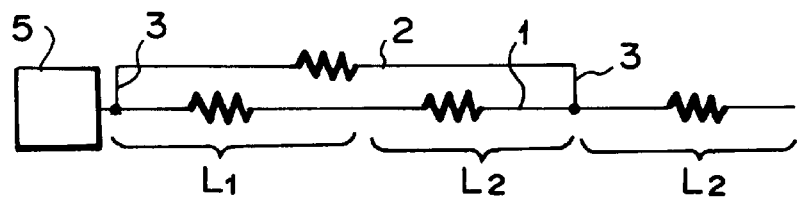
FIG. 7 is a partial construction diagram showing the connection relationship of an X decoder, the word lines and the aluminum assist wire of the semiconductor integrated circuit device of the present invention.

Next, the operation time of the word line when the outermost contact is provided slightly nearer to the center than the far end of the word line according to this embodiment will be calculated. FIG. 7 is a partial construction diagram showing the connection relationship of the X decoder 5, the word line 1 and the aluminum assist wire 2 of the semiconductor integrated circuit device of this embodiment, and shows such a state that the word line and the aluminum assist wire are brought into contact with each other at a slightly nearer position to the center than the far end of the word line.

In FIG. 7, the wiring length of the word line is divided into a first, second and third parts each having a length of $L_1$, $L_2$ and $L_2$ respectively from the near end to the far end. It is assumed that the first part of the word line is operated through the contact of the near end, and the second and third parts of the word line are operated through the contact between the center and the far end. The operation time of the first part having a length of $L_1$ is represented by $T_1$, and the operation time of the second and third parts both having a length of $L_2$ is represented by $T_2$. Representing the capacitance per unit length by c and representing the resistance per unit length by r, the following equations are satisfied:

$$T_1 = cL_1 \times rL_1 = crL_1^2 \quad (3)$$

$$T_2 = 2(cL_2 \times rL_2) = 2\ crL_2^2 \quad (4)$$

Now, the relationship between $L_1$ and $L_2$ when the operation times of the first part and the second and third parts are equal to each other will be determined. From the equations (3), (4), $$T_1 = T_2 = crL_1^2 = 2\ crL_2^2$$

From the above equation, $$L_1 = 1.41 \times L_2 \quad (5)$$

From the above equation and the following equation, $$L_1 {-}_L {-} 2\ L_2$$

the following equation is satisfied:

$$L_2 = L/3.41 = 0.29 \times L \quad (6)$$

From the above equation (6), it is apparent that if the outermost contact is located at a position which is nearer to the center from the far end portion by the distance corresponding to about 29% of the word line length, the operation times of the first part having the length of $L_1$ and the second and third parts having the length of $L_2$ are equal to each other.

Further, from the equation (4), the operation time at the far end portion of the word line when the operation times of the first part and the second and third parts are equal to each other is expressed as follows:

$$T_2 = 2\ cr(0.29\ L)^2 = 0.17\ crL^2 \quad (7)$$

Accordingly, the operation time can be set to be shorter than the operation time of the conventional SRAM using the aluminum assist method for word lines which is expressed by the equation (2).

As is apparent from the foregoing description, in order to reduce the chip size, the outermost connection (contact) position between the word line and the aluminum assist wire is shifted from the far end portion slightly toward the center, and the aluminum assist wire is disposed so as to extend to the contact position (not to the end portion of the word line) in conformity with the position of the shifted contact 3, thereby shorten the operation time of selection or non-selection as compared with the word line before the above structural modification.

Further, with the above construction, the signal/power source lines 10, 11 can be disposed in parallel to the digit lines in the area between the end portions of the aluminum assist wires and the end portions of the word lines, thereby reducing the chip size.

<Second Embodiment>

Figure 8:
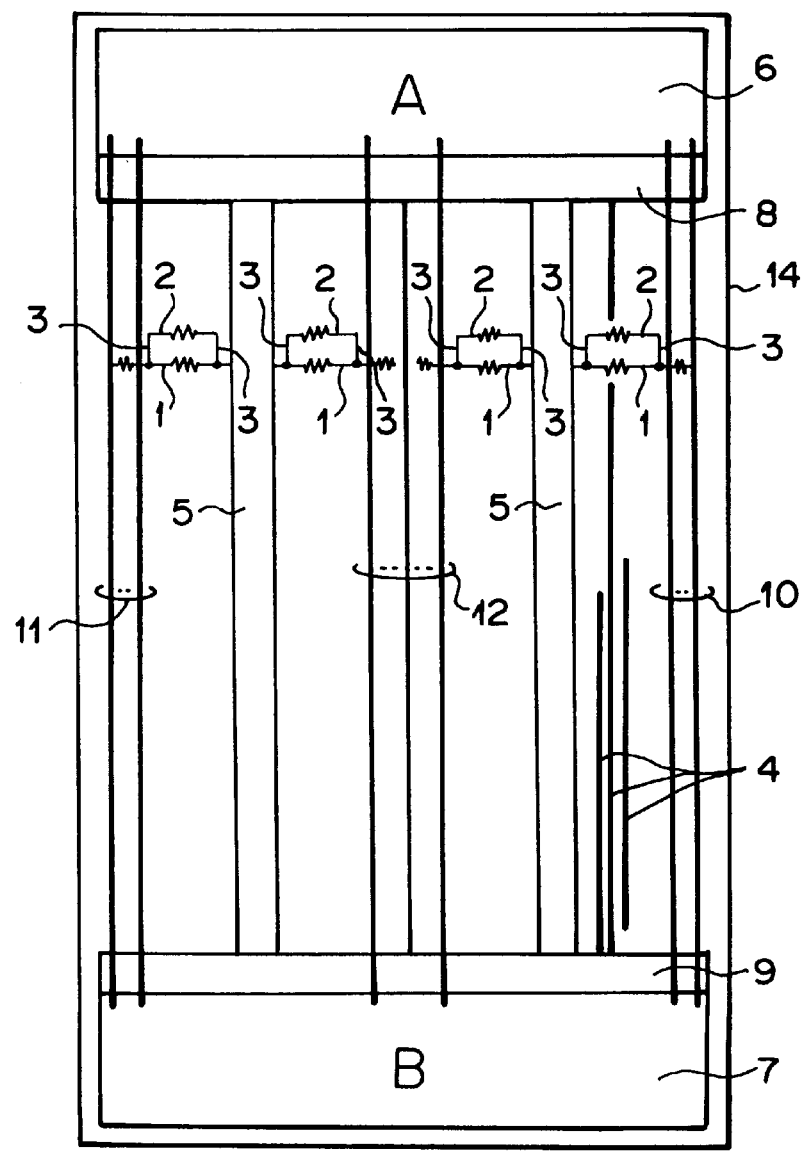
FIG. 8 is a diagram showing the overall construction of a second embodiment of the semiconductor integrated circuit device according to the present invention.

FIG. 8 is a diagram showing the construction of a second embodiment of the semiconductor integrated circuit device of the present invention.

In FIG. 8, reference numeral 1 represents word lines formed of polysilicon, reference numeral 2 represents assist wires arranged in parallel to the word lines 1 so as to form the second aluminum wiring layer, reference numeral 3 represents contacts for connecting the word lines 1 and the aluminum assist wires 2, reference numeral 4 represents digit lines arranged so as to form the first aluminum wiring layer, reference numeral 5 represents an X decoder for selecting a word line, reference numeral 6 represents a peripheral circuit A provided at one end portion of the digit lines 4, and reference numeral 7 represents a peripheral circuit B provided at the other end portion of the digit lines 4.

In this embodiment, the peripheral circuit A contains a system extending from an address buffer circuit to a decoder circuit for selecting a word line, a system extending from an address buffer circuit to a decoder circuit for selecting a section, a clock system circuit for controlling the inside on the basis of a clock generated due to switching of addresses, a CE2 control system circuit, a WE control system circuit, and pads for each address, control system, GND, etc. The peripheral circuit B contains a system extending from an address buffer to a decoder circuit for selecting a digit line, a clock system circuit for controlling the inside on the basis of a clock generated due to switching of addresses, a control system circuit for CE1 and OE, a sense amplifier circuit, an input/output transistor, and pads for each address, CE1, input/output, VCC, etc.

Reference numerals 8, 9 represent array portions around the digit lines, which portions are designed in a cell-pitch structure. Reference numerals 10, 11 represent signal/power source lines (signal lines and power source lines) through which signals are transmitted between the peripheral circuit A and the peripheral circuit B. The signal/power source lines contain a signal line for the control system for the CE1, CE2 which controls the switching between a stand-by state and an active state, a signal line for the control system for WE which controls the switching between WRITE and READ, a signal line for the clock system, a signal line for selecting a section, etc. Reference numeral 12 represents signal/power lines disposed in parallel to the digit lines at the center of the chip 14.

The structural difference between the first and second embodiments is as follows. In the semiconductor integrated circuit device of the first embodiment, only one X decoder 5 is disposed at the center portion of the overall memory cell array areas 13, however, in the second embodiment, another X decoder 5 is added to dispose each X decoder between the center portion and each of both the end portions of the overall memory cell array areas 13.

In the first embodiment, only one X decoder 5 is disposed at the center portion, and thus the area where the signal lines and the power source lines are disposed can be formed only in the memory cell array area 13 at the far end portion which is separated from the X decoder 5. For the above reason, even the signal lines which reach to the center portion of the peripheral circuit must be extended to and along the long side of the chip in case of some circuit construction. Further, the power source lines must be extended to and along the long side of the chip. Therefore, the delay time becomes somewhat long and this is unfavorable on the circuit characteristic.

In the second embodiments, two X decoders 5 are provided. In other words, the division number of the word line is twice. Therefore, an empty area for metal wires for assisting the word lines can be formed not only at the long side, but also at the center portion of the overall memory cell array areas 13. For example, it is not required to extend the signal line which reaches to the center of the peripheral circuit A to and along the long side for connection to the peripheral circuit B and, such a signal line can be disposed at the center portion. Further, the power source line also can be disposed at both the long side and the center portion, so that the power source line can be magnified.

In the above-mentioned embodiments, additional contacts for connecting the word lines and the aluminun assist wires may be provided between the contact 3 at both ends of the aluminun assist wires.

What is claimed is:

1. A semiconductor integrated circuit device in which metal assist wires for increasing an operating speed of word lines extending from a decoder are disposed in parallel to the word lines, characterized in that each of the metal assist wires extends from a first position near the decoder to a second position between the first position and an end portion of a word line, and signal/power source lines are formed in parallel to digit lines in an area locating between end portions of the metal assist wires corresponding to the second position and the end portions of the word lines.

2. The semiconductor integrated circuit device as claimed in claim 1, wherein the metal assist wires are connected to the word lines at least at the first and second positions.

3. The semiconductor integrated circuit device as claimed in claim 1, wherein the signal/power source lines and the metal assist wires are arranged to form the same metal wiring layer.

4. The semiconductor integrated circuit device as claimed in claim 1, wherein the word lines extend from the decoder at both sides thereof.

5. A semiconductor integrated circuit device in which metal assist wires for increasing an operating speed of word lines extending from a decoder are disposed in parallel to the word lines, characterized in that:

signal/power source lines are arranged to form the same metal wiring layer as that of the metal assist wires in parallel to digit lines at a center of overall memory cell array areas;

two decoders for selecting word lines are provided to divide the overall memory cell array areas into three parts of a center area portion and both end area portions;

metal assist wires are provided in parallel to the word lines at the center area portion so as to extend from the vicinity of the decoders to the vicinity of the signal/power source lines disposed at the center of the overall memory cell array areas;

metal assist wires are provided in parallel to the word lines at both the end area portions so as to extend from the vicinity of the decoders to halfway positions toward end portions of the word lines at both the end area portions; and signal/power source lines are arranged to form the same metal wiring layer as that of the metal assist wires in parallel to the digit lines at both end portions of the overall memory cell array areas corresponding to an area from the halfway positions to the end portions of the word lines.

6. The semiconductor integrated circuit device as claimed in claim 5, wherein the metal assist wires are connected to the word lines at least both ends of the metal assist wires.

* * * * *